(12) United States Patent
Wang et al.

(10) Patent No.: US 10,276,417 B2
(45) Date of Patent: Apr. 30, 2019

(54) PRE-ALIGNMENT DEVICE AND METHOD FOR WAFER

(71) Applicant: SHANGHAI MICRO ELECTRONICS EQUIPMENT (GROUP) CO., LTD., Shanghai (CN)

(72) Inventors: Gang Wang, Shanghai (CN); Yunbin Pu, Shanghai (CN); Shaoyu Wang, Shanghai (CN); Jiaozeng Zheng, Shanghai (CN); Jie Jiang, Shanghai (CN)

(73) Assignee: SHANGHAI MICRO ELECTRONICS EQUIPMENT (GROUP) CO., LTD., Shanghai (CN)

( * ) Notice: Subject to any disclaimer, the term of this patent is extended or adjusted under 35 U.S.C. 154(b) by 0 days.

(21) Appl. No.: 15/568,657

(22) PCT Filed: Apr. 22, 2016

(86) PCT No.: PCT/CN2016/079979
§ 371 (c)(1),
(2) Date: Oct. 23, 2017

(87) PCT Pub. No.: WO2016/169511
PCT Pub. Date: Oct. 27, 2016

(65) Prior Publication Data
US 2018/0151400 A1    May 31, 2018

(30) Foreign Application Priority Data
Apr. 24, 2015   (CN) .......................... 2015 1 0203515

(51) Int. Cl.
*H01L 21/68* (2006.01)
*H01L 21/687* (2006.01)
(Continued)

(52) U.S. Cl.
CPC ............ *H01L 21/68* (2013.01); *G06T 7/0004* (2013.01); *G06T 7/73* (2017.01);
(Continued)

(58) Field of Classification Search
None
See application file for complete search history.

(56) References Cited

U.S. PATENT DOCUMENTS 3,930,684 A * 1/1976 Lasch, Jr. ........... H01L 21/6779
                                                        406/12
4,376,581 A * 3/1983 Mayer ...................... G03F 9/70
                                                        355/41
(Continued)

FOREIGN PATENT DOCUMENTS

CN        101128928 A     2/2008
CN        101216686 A     7/2008
(Continued)

*Primary Examiner* — Ramesh B Patel
(74) *Attorney, Agent, or Firm* — Muncy, Geissler, Olds & Lowe, P.C.

(57) ABSTRACT

An apparatus for pre-aligning a wafer comprises: a wafer stage for carrying the wafer, wherein a first alignment mark (W1) and a second alignment mark (W2) are arranged on the wafer such that they are substantially symmetrical to each other with respect to a center of the wafer; a peripheral vision acquisition system (1), configured to perform a first positional compensation for the wafer based on a relative positional relationship of an edge or a notch of the wafer with respect to the wafer stage; and a mark detection system (4), configured to capture images of the first and second alignment marks (W1, W2) and perform a second positional compensation for the wafer by determining a relative positional relationship of the center of the wafer with respect to a center of the wafer stage based on the positions of the first and second alignment marks (W1, W2) in a coordinate system of the mark detection system, wherein the coordinate
(Continued)

system of the mark detection system (4) has a horizontal axis (X) defined by a line passing through the center of the wafer stage and a center of the mark detection system (4) and a vertical axis (Y) defined by a line crossing the horizontal axis (X) at right angles and passing through the center of the wafer stage.

9 Claims, 4 Drawing Sheets

(51) Int. Cl.
  *H01L 23/544* (2006.01)
  *G06T 7/73* (2017.01)
  *G06T 7/00* (2017.01)
(52) U.S. Cl.
  CPC ...... *H01L 21/68764* (2013.01); *H01L 23/544* (2013.01); *G06T 2207/30148* (2013.01)

(56) References Cited

U.S. PATENT DOCUMENTS

| | | | | |
|---|---|---|---|---|
| 4,461,567 A | * | 7/1984 | Mayer | G03F 9/70 355/125 |
| 5,044,752 A | * | 9/1991 | Thurfjell | H01L 21/67259 250/548 |
| 5,264,918 A | * | 11/1993 | Kagami | H01L 21/681 356/150 |
| 5,563,798 A | * | 10/1996 | Berken | G05B 19/402 318/640 |
| 6,237,393 B1 | * | 5/2001 | Ames | G03F 7/7075 73/1.79 |
| 6,936,385 B2 | * | 8/2005 | Lof | G03F 9/7011 355/53 |
| 7,706,908 B2 | * | 4/2010 | Scholte Van Mast | H01L 21/682 414/217 |
| 7,848,832 B2 | * | 12/2010 | Komiya | H01L 21/682 700/114 |
| 9,418,882 B2 | * | 8/2016 | Thallner | B65G 47/26 |
| 2002/0113218 A1 | * | 8/2002 | Okumura | G03F 7/70691 250/548 |
| 2004/0031779 A1 | * | 2/2004 | Cahill | B23K 26/04 219/121.83 |
| 2004/0151574 A1 | * | 8/2004 | Lu | H01L 21/681 414/816 |
| 2008/0019817 A1 | * | 1/2008 | Komiya | B23Q 1/44 414/749.6 |
| 2008/0029715 A1 | | 2/2008 | Morikazu et al. | |
| 2011/0260057 A1 | * | 10/2011 | Otaka | H01J 37/20 250/307 |
| 2013/0139950 A1 | * | 6/2013 | Kannaka | G01B 11/272 156/64 |
| 2015/0138566 A1 | * | 5/2015 | Wagenleitner | H01L 21/681 356/614 |

FOREIGN PATENT DOCUMENTS

| | | |
|---|---|---|
| CN | 104364892 A | 2/2015 |
| TW | 201513259 A | 4/2015 |

* cited by examiner

PRE-ALIGNMENT DEVICE AND METHOD FOR WAFER

TECHNICAL FIELD

The present invention relates to the field of manufacturing of integrated circuit devices and, in particular, to an apparatus and method for pre-aligning a wafer.

BACKGROUND

A peripheral vision acquisition system can be used to capture images of an edge (e.g., a plain edge) or a notch of a wafer. The captured images can be subjected to image processing and calculation in order to obtain deviations in centering and orientation of the wafer from a wafer stage, based on which centering and orientation assemblies in the wafer stage system can perform compensation. Wafers produced by different manufacturers may have varying wafer shapes and notch shapes and possibly different relative positional relationships between marks and the notch, and pre-alignment systems of different photolithography tools may have different centering and orientation accuracy. Consequently, wafer placement accuracy sometimes cannot meet the requirements of the photolithography tool for the next process.

SUMMARY OF THE INVENTION

In order to overcome the drawbacks of the prior art, the present invention proposes a high-accuracy apparatus and method for pre-alignment of a wafer.

To this end, the proposed apparatus comprises: a wafer stage for supporting the wafer, wherein a first alignment mark and a second alignment mark are provided on the wafer such that they are substantially symmetrical to each other with respect to a center of the wafer; a peripheral vision acquisition system, configured to perform a first positional compensation for the wafer based on a relative positional relationship of an edge or a notch of the wafer with respect to the wafer stage; and a mark detection system, configured to capture images of the first and second alignment marks and perform a second positional compensation for the wafer by determining a relative positional relationship of the center of the wafer with respect to a center of the wafer stage based on positions of the first and second alignment marks in a coordinate system of the mark detection system, wherein the coordinate system of the mark detection system has a horizontal axis defined by a line passing through the center of the wafer stage and a center of the mark detection system and a vertical axis defined by a line crossing the horizontal axis at right angles and passing through the center of the wafer stage.

Additionally, the mark detection system may be configured to calculate a rotation angle and a deviation between a coordinate system of the alignment marks and the coordinate system of the mark detection system based on coordinates of the first and second alignment marks in the coordinate system of the mark detection system, and to further determine a relative positional relationship between the center of the wafer and the center of the wafer stage based on the rotation angle, the deviation and a relative positional relationship between an origin of the coordinate system of the alignment marks and the center of the wafer, wherein the coordinate system of the alignment marks has a horizontal axis defined by a line segment connecting the first and second alignment marks, the origin defined as a midpoint of the line segment connecting the first and second alignment marks and a vertical axis defined by a line passing through the origin and crossing the line at right angles.

Additionally, the peripheral vision acquisition system may comprise a linear array CCD detector, with the mark detection system comprising a planar array CCD detector.

Additionally, the mark detection system may comprise a motion assembly, a focus adjustment assembly and a vision assembly for mark acquisition, the motion assembly configured to drive the vision assembly for mark acquisition to search for the first or second alignment mark, the focus adjustment assembly configured to adjust a focal length of the vision assembly for mark acquisition with respect to the first or second alignment mark, the vision assembly for mark acquisition configured to capture an image of the first or second alignment mark.

Additionally, the focus adjustment assembly may be connected to the motion assembly, with the vision assembly for mark acquisition connected to the focus adjustment assembly, wherein the motion assembly is configured to drive the focus adjustment assembly to move along a radial direction of the wafer, and the focus adjustment assembly is configured to drive the vision assembly for mark acquisition to move along a vertical direction.

Additionally, the vision assembly for mark acquisition may comprise a point light source, a lens and a planar array CCD camera.

Additionally, the peripheral vision acquisition system and the mark detection system may be located on opposing sides of the wafer along a radial direction of the wafer.

The proposed method comprises the steps of: 1) providing a first alignment mark and a second alignment mark on the wafer, which are substantially symmetrical to each other with respect to a center of the wafer; 2) performing a first positional compensation for the wafer by a peripheral vision acquisition system based on a relative positional relationship of an edge or a notch of the wafer with respect to a wafer stage; 3) searching for the first and second alignment marks on the wafer and capturing images thereof by a mark detection system; 4) determining a relative positional relationship between the center of the wafer and a center of the wafer stage based on positions of the first and second alignment marks in a coordinate system of the mark detection system; and 5) performing a second positional compensation for the wafer based on the determined relative positional relationship between the center of the wafer and the center of the wafer stage, wherein the coordinate system of the mark detection system has a horizontal axis defined by a line passing through the center of the wafer stage and a center of the mark detection system and a vertical axis defined by a line crossing the horizontal axis at right angles and passing through the center of the wafer stage.

Additionally, step 4) may comprise calculating a rotation angle and a deviation between a coordinate system of the alignment marks and the coordinate system of the mark detection system based on coordinates of the first and second alignment marks in the coordinate system of the mark detection system, and further determining a relative positional relationship between the center of the wafer and the center of the wafer stage based on the rotation angle, the deviation and a relative positional relationship between an origin of the coordinate system of the alignment marks and the center of the wafer, wherein the coordinate system of the alignment marks has a horizontal axis defined by a line segment connecting the first and second alignment marks, the origin defined as a midpoint of the line segment connecting the first and second alignment marks and a vertical axis defined by a line passing through the origin and crossing the line segment at right angles.

Compared to the prior art, the proposed technical solution can achieve higher wafer centering and orientation accuracy and hence higher wafer placement accuracy through capturing images of the first and second alignment marks and subjecting them to calculation after coarse pre-alignment (i.e., the first positional compensation).

BRIEF DESCRIPTION OF THE DRAWINGS

The advantages and the spirit of the present invention will be further understood from the following detailed description and the accompanying drawings.

DETAILED DESCRIPTION

Specific embodiments of the present invention will be described in detail with reference to the accompanying drawings.

Embodiment 1

The conventional approaches can only achieve coarse pre-alignment by scanning the wafer edge and notch. According to the present invention, higher wafer centering and orientation accuracy can be achieved by performing a further alignment using two marks subsequent to the coarse pre-alignment so that the resulting wafer placement accuracy is more likely to meet the requirements.

In order to improve the centering and orientation accuracy of a wafer to be placed on a wafer stage, the wafer is pre-aligned based on images of its edges and then calibrated by a mark detection system using alignment marks, in order to achieve higher placement accuracy.

To this end, the mark detection system is designed to be able to: 1) more accurately align the alignment marks on the wafer to be placed on the wafer stage into an alignment field of view so as to avoid excessive errors in wafer placement accuracy caused by variations in mark geometry, size and position between different wafers; 2) act as measuring device to measure coordinate deviations of the alignment marks with respect to the wafer geometry; and 3) calculate an angular deviation of the positions of the alignment marks in a coordinate system of the wafer from their positions in a coordinate system of the mark detection system through comparing their expected and measured positions in the coordinate system of the mark detection system.

Measurement data obtained by the mark detection system are used for positional compensation for the wafer so that it is placed successfully on the wafer stage with sufficient centering and orientation accuracy.

Figure 1:
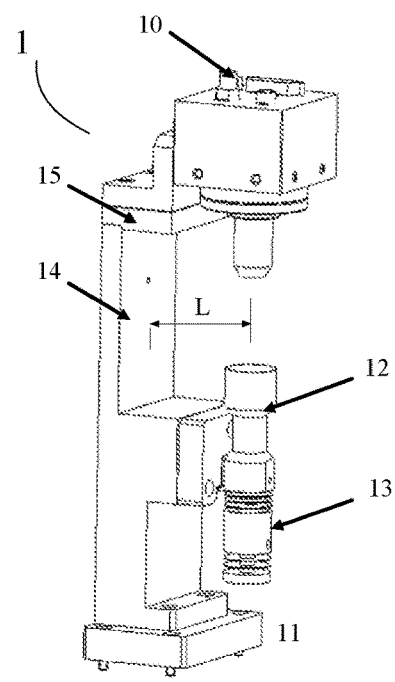
FIG. 1 is a structural schematic of a peripheral vision acquisition system for capturing images of the edge of a wafer in a wafer pre-alignment apparatus according to the present invention.
Figure 2:
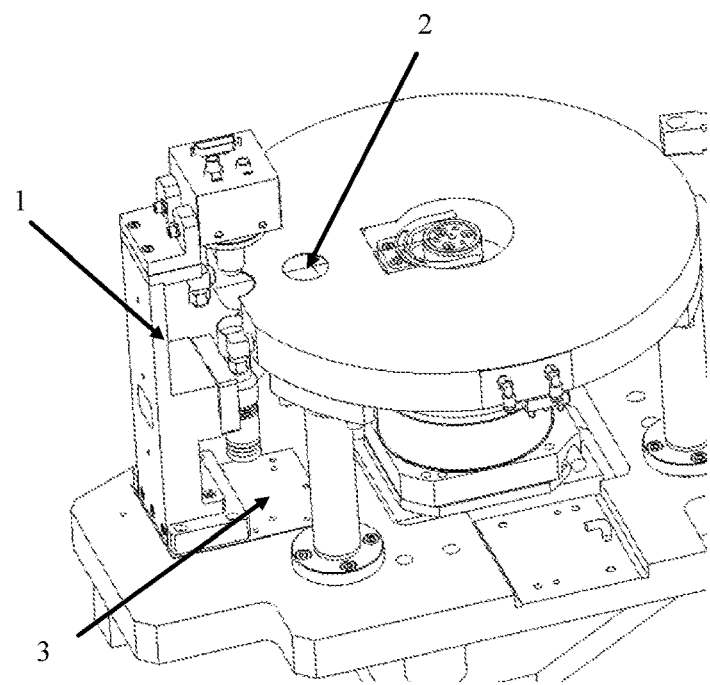
FIG. 2 schematically shows where the peripheral vision acquisition system according to the present invention is mounted.

FIG. 1 is a structural schematic of a peripheral vision acquisition system for capturing images of the wafer edge in a wafer pre-alignment apparatus according to the present invention. The peripheral vision acquisition system is configured essentially to capture images of the wafer edge, which are then subjected to image processing and calculation in order to obtain deviations in centering and orientation of the wafer. Based on the calculation results, centering and orientation assemblies in the wafer stage system perform compensation for the deviations. As shown in FIG. 1, the peripheral vision acquisition system 1 is essentially composed of a linear array CCD camera 10, a base 11, a light source 12, a lens 13, a bracket 14 and an adjustment member 15. Adjusting the adjustment member 15 can ensure a sufficient distance L from a center of the lens 13 to an inner surface of the bracket 14 for switching from an 8" wafer to a 12" one. FIG. 2 schematically shows where the peripheral vision acquisition system according to the present invention is mounted. As shown in FIG. 2, the peripheral vision acquisition system 1 is mounted along a radial pre-alignment direction (i.e., a radial direction of the wafer) at a location 3 on one side of the wafer. A channel 2 is further perforated in a moisture-tight plate in order to allow edge image acquisition for 8" wafers.

Figure 3:
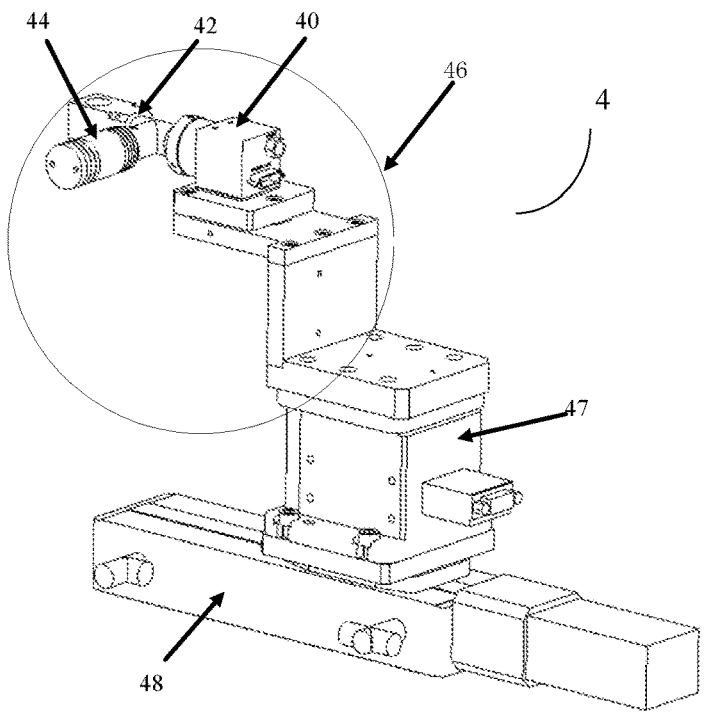
FIG. 3 shows a schematic illustration of a mark detection system in the wafer pre-alignment apparatus according to the present invention.

FIG. 3 shows a schematic illustration of a mark detection system in a wafer pre-alignment apparatus according to the present invention. As shown in FIG. 3, the mark detection system is required to be able to: 1) search for alignment marks on the wafer surface; 2) adjust the distance from the camera (or lens) to wafer surface so that alignment marks on wafers of different thicknesses can be clearly visible; and 3) measure positional deviations of the alignment marks with respect to a geometric center of the wafer. The mechanics of the mark detection system are designed based on these three requirements as well as on input design constraints.

As shown in FIG. 3, the mark detection system 4 is essentially composed of a motion assembly 48, a focus adjustment assembly 47 and a vision assembly for mark acquisition 46. The motion assembly 48 is configured to drive the vision assembly for mark acquisition 46 to move radially over the wafer so that the latter can perform a search for the marks on the wafer surface. The focus adjustment assembly 47 is configured to drive the vision assembly for mark acquisition 46 to move along the vertical Z-direction so that a focal plane for mark detection may be adjusted to a location where clear images of the alignment marks may be captured. The vision assembly for mark acquisition 46 is configured for imaging of the alignment marks on the wafer and acquisition, transfer and processing of their images. The motion assembly 48 and the focus adjustment assembly 47 are both high-accuracy assemblies. The vision assembly for mark acquisition 46 is mounted on the focus adjustment assembly 47 which is, in turn, mounted on the motion assembly 48.

The vision assembly for mark acquisition 46 comprises a point light source 44, a lens 42 and a planar array CCD camera 40. In order to be able to handle both 200-mm and 300-mm wafers, the motion assembly is designed to be able to travel a total length of 80 mm in which 75 mm is effective.

The focus adjustment assembly is designed to be able to travel a total length of 8 mm in which 5 mm is effective.

Figure 4:
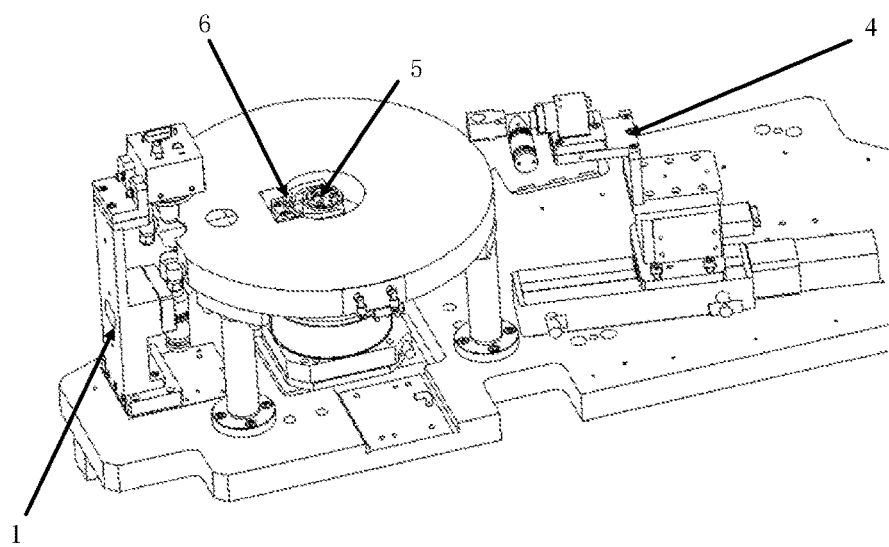
FIG. 4 is a schematic showing where the mark detection system in the wafer pre-alignment apparatus according to the present invention is mounted.

FIG. 4 is a schematic showing where the mark detection system is mounted in the wafer pre-alignment apparatus according to the present invention. As shown in FIG. 4, the mark detection system 4 is mounted along a radial pre-alignment direction on the other side of the wafer (i.e., opposite to the peripheral vision acquisition system 1). The wafer stage includes an R-directional (i.e., the direction about the vertical Z-direction) motion assembly 5 and an eccentricity compensation assembly 6.

Figure 5:
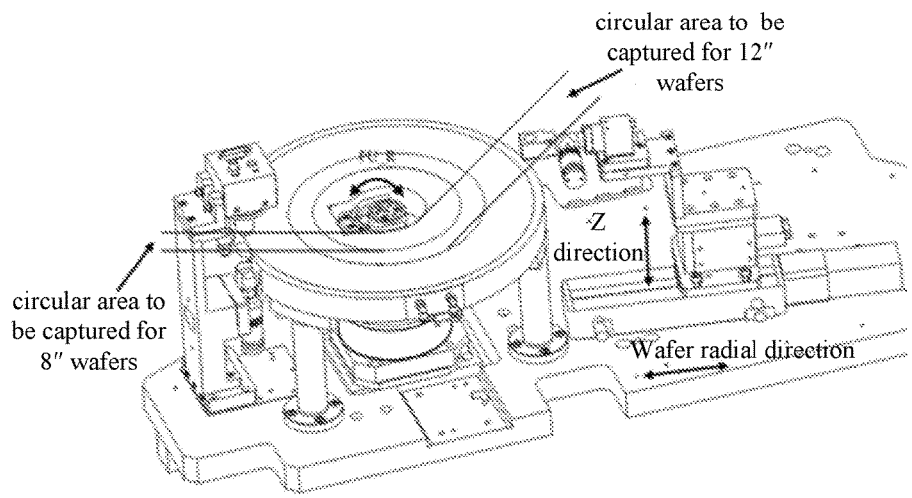
FIG. 5 is a diagram schematically showing an area that can be imaged by the peripheral vision acquisition system and mark detection system in the wafer pre-alignment apparatus according to the present invention, which work together with each other.

FIG. 5 is a diagram schematically showing an area that can be imaged by the peripheral vision acquisition system and mark detection system in the wafer pre-alignment apparatus according to the present invention, which work together with each other. Clear images of alignment marks on a 8" or 12" wafer can be captured under the effect of the R-directional motion assembly 5 rotating about the Z-axis in cooperation with the peripheral vision acquisition system, the motion assembly of the mark detection system moving radially in cooperation with the focus adjustment assembly and the linear array CCD working together with the planar CCD array. The captured images can be subjected to image processing to allow higher centering and orientation accuracy of the pre-alignment process.

Embodiment 2

Figure 7:
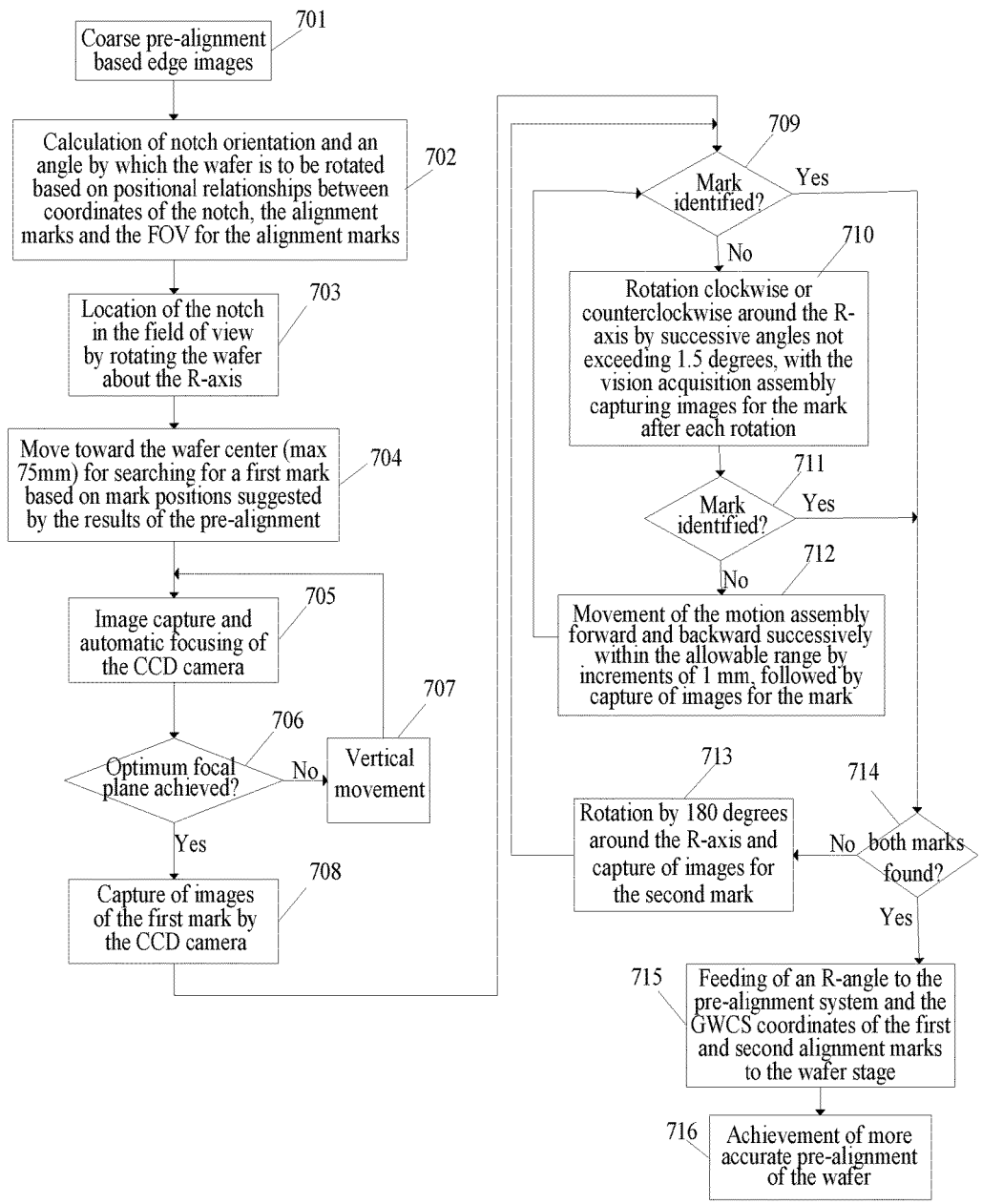
FIG. 7 is a flow chart of a wafer pre-alignment method according to the present invention.

FIG. 7 is a flow chart of a wafer pre-alignment method according to the present invention. As shown in FIG. 7, the method includes the steps as detailed below. In step 701, the peripheral vision acquisition system performs a coarse pre-alignment process based on captured images of the wafer edge. In step 702, the orientation of the notch is calculated and an angle by which the wafer is to be rotated is also calculated based on positional relationships between the notch, the alignment marks and the field of view for the alignment marks. In step 703, the wafer is rotated along the R-axis (i.e., the axis of rotation about the vertical Z-direction) so that the notch is located within the alignment field of view. In step 704, based on mark positions suggested by the results of the pre-alignment process, the motion assembly searches for a first mark by moving radially toward the center of the wafer, wherein the maximum effective length that the motion assembly can travel is 75 mm. In step 705, the CCD camera captures images and performs automatic focusing. In step 706, it is determined whether an optimum focal plane is achieved. If the determination is positive, the control proceeds to step 708 in which the vision assembly for mark acquisition captures images for the first alignment mark; otherwise, the control proceeds to step 707 in which the focus adjustment assembly is moved vertically and the control loops back to step 705. In step 709, it is checked whether any of the image captured in step 708 contains the alignment mark (i.e., the first alignment mark). If the alignment mark is identified, the control proceeds to step 714 in which it is determined whether the two alignment marks have been both identified. If no alignment mark is identified in step 709, the control proceeds to step 710 in which the wafer is rotated clockwise or counterclockwise along the R-axis by successive angles not exceeding 1.5 degrees, with the vision assembly for mark acquisition again capturing images for the alignment mark (i.e., the first alignment mark) after each rotation. In step 711, it is again determined whether the alignment mark has been identified. If the determination is positive, the control proceeds to step 714; otherwise, it proceeds to step 712, in which the motion assembly is moved forward and backward successively within the allowable range by increments of 1 mm, followed by the performance of step 709 after each incremental movement. If the first mark has been identified with the second mark having been not, then the control proceeds to step 713 in which the wafer is rotated by 180 degrees along the R-axis, the vision assembly for mark acquisition captures images for the second alignment mark and the control loops back to step 709. Once both alignment marks have been found in step 714, step 715 is performed in which positional deviations of the wafer from the wafer stage are calculated based on coordinates of the first and second alignment marks. An R-angle is fed back to the pre-alignment system, and the coordinates of the first and second alignment marks in the coordinate system of the wafer (GWCS) are fed back to the wafer stage. Here, the R-angle refers to an angle defined by the two lines each connecting an origin of the coordinate system of the wafer and one of the two alignment marks, and the coordinate system of the wafer is originated at the center of the wafer and has a Y-axis passing through a center of the plain edge portion/notch and the center of the wafer and an X-axis passing through the center of the wafer and crossing the Y-axis at right angles. In step 716, a more accurate pre-alignment is performed on the wafer.

In step 704, in order to facilitate the search for the alignment marks, theoretic GWCS positions of the marks (determined once the marks have been formed) and measured values of eccentricity and angular deviation of the wafer obtained from the coarse pre-alignment process may be leveraged.

In order to fully explain the present invention, an assumed basic scenario for high-accuracy pre-alignment is described below.

Figure 6:
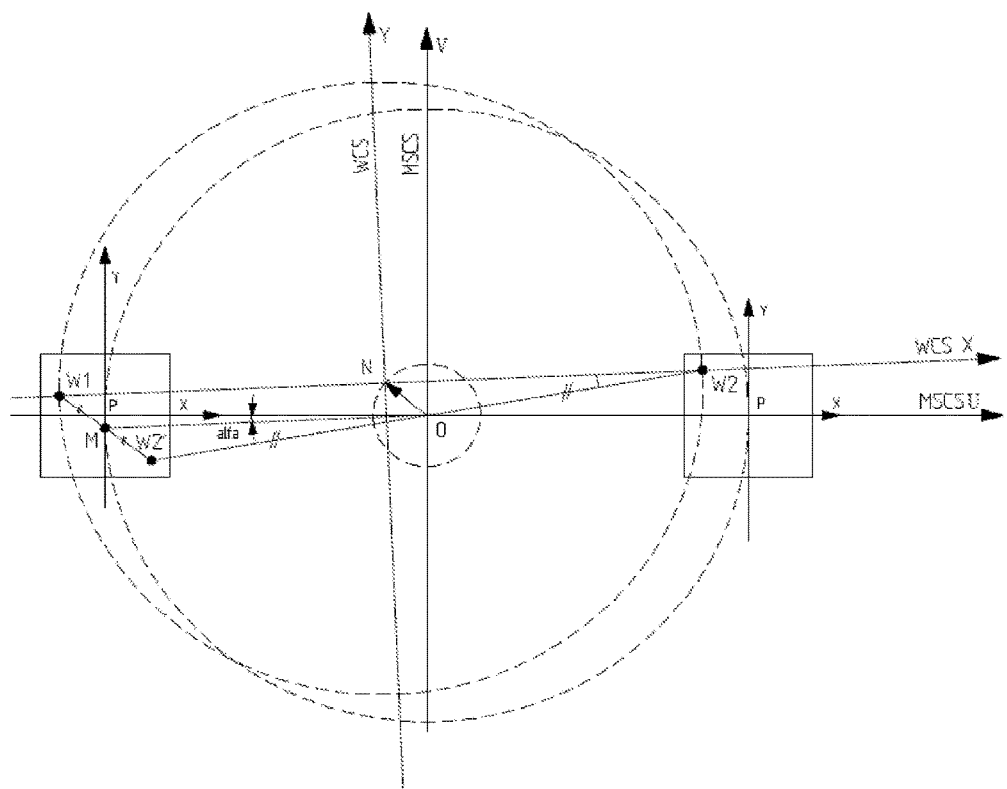
FIG. 6 is a schematic illustration of a use scenario of the wafer pre-alignment apparatus according to the present invention.

Assuming there is only a small degree of eccentricity of the wafer with respect to the wafer stage and the two marks MARK1 and MARK2 are arranged in symmetry on the wafer, and thus it is not necessary for the mark detection system to search for MARK1 and MARK2 by stepwise rotation of the wafer about the R-axis. As shown in FIG. 6, which is a schematic illustration of the use scenario of the wafer pre-alignment apparatus of the present invention, W1 and W2 indicate the two marks MARK1 and MARK2 which are arranged in symmetry on the wafer, and N represents an origin of a coordinate system defined by the alignment marks (referred to as the "WCS coordinate system" hereinafter), wherein the origin N is located at a midpoint of a line segment connecting the two marks. The WCS coordinate system has a Y-axis passing through the origin N and crossing the line segment at right angles and an X-axis (horizontal) extending along the line segment. The direction leading from the origin toward the plain edge portion/notch of the wafer is defined as a −Y direction. The marks MARK1 and MARK2 have the same radius, i.e., W1N=W2N. O represents an origin of a MSCS coordinate system, wherein the MSCS coordinate system refers to a coordinate system of the mark detection system. A U-axis is defined by a line passing through a center of the wafer stage and a center of the mark detection system, and a V-axis is defined by a line crossing the U-axis at right angles and passing through the center of the wafer stage. W2' denotes a position of MARK2 after the wafer is rotated by 180 degrees about O, and M represents a midpoint of the segment W1W2'. Therefore, we can easily obtain MO=W1N=W2N. The angle α is a rotation angle between the WCS and MSCS coordinate systems, and P indicates a center of the field of view for mark detection. The distance between N and O (referred to as NO) is equal to W1M or MW2'.

Based on these, we can obtain $$\alpha = \arcsin\left(\frac{|Y(W1) + Y(W2')|}{2*W1N}\right),$$

where, Y(W1) denotes the Y-coordinate value of the alignment mark W1 in the MSCS coordinate system, and Y(W2') represents the Y-coordinate value of the alignment mark W2 after it is rotated by 180 degrees in the MSCS coordinate system.

The calculated rotation angle α is fed to the wafer stage system to enable the centering and orientation assemblies in the wafer stage system to perform accurate positional compensation of the wafer with respect to the wafer stage. As such compensation is known to those skilled in the art, a further description thereof is omitted herein.

It can be easily appreciated that the origin O of the WSCS coordinate system is coincide with the center of the wafer stage, and the relative position between the origin N of the WCS coordinate system (i.e., the midpoint of the line segment connecting the two marks) and the center of the wafer can be determined beforehand (when the two marks are located exactly in symmetry with respect to the center of the wafer, N is coincide with the center of the wafer, and even when the two marks are not symmetric to each other with respect to the center of the wafer, a deviation of the origin N from the center of the wafer can be easily calculated). Therefore, once the positional relationship between the points O and N is determined, it is easy to derive the positional relationship between O and the center of the wafer, based on which the center of the wafer can be adjusted into coincidence with the center of the wafer stage by the wafer stage system.

Embodiment 3

In this embodiment, the two alignment marks W1 and W2 on the wafer are not symmetrical to each other, but a line passing through them also passes through the center of the wafer. That is, the two alignment marks W1 and W2 are not equidistant from the center of the wafer. Differing from Embodiment 2, after the first alignment mark W1 has been identified, the mark detection system needs to search for the second alignment mark W2 by rotating the wafer along the R-axis in accordance with this embodiment.

Embodiment 4

This embodiment differs from Embodiment 3 in that, in addition to the asymmetry of the two alignment marks W1 and W2 on the wafer, there is a significant degree of eccentricity between the wafer and the wafer stage. That is, the center of the wafer does not reside at the center of the wafer stage and is much deviated therefrom. Compared to Embodiment 3, after the first alignment mark W1 has been identified, the mark detection system always searches for the second alignment mark W2 by rotating the wafer along the R-axis, and the rest is the same as Embodiment 2. The only difference is that the actual position of the alignment mark W2 is determined based on its measured position in the GWCS coordinate system and its expected position in the WCS coordinate system.

Embodiment 5

In this embodiment, the positions of the two alignment marks W1 and W2 on the wafer are associated with different angles, and the line passing through them does not pass through the center of the wafer. Additionally, the two alignment marks W1 and W2 are not equidistant from the center of the wafer. In fact, the pre-alignment in this case is not substantively different from that of Embodiment 4, and a further description thereof is omitted herein.

According to these embodiments, the positional relationships between the MSCS, GWCS and WCS coordinate systems are determinable, and more accurate alignment can be achieved based on the results of the coarse alignment.

In general cases, the deviations of the wafer with respect to the wafer stage and positional deviations of the marks are not significant after the coarse alignment is performed, and accurate alignment could be achieved in accordance with Embodiments 2 and 3. Embodiments 4 and 5 are presented to describe how to achieve accurate alignment in extremely rare cases in order to ensure that all wafer conditions are covered.

Disclosed herein are merely several preferred particular embodiments of the present invention, which are intended to explain the subject matter of the invention rather than limit the scope thereof. All embodiments made by those skilled in the art by means of logical analysis, reference or limited experimentation based on the teachings of the invention are embraced within the scope of the invention.

What is claimed is:

1. A pre-alignment apparatus for a wafer, comprising:
   a wafer stage for supporting the wafer, wherein a first alignment mark and a second alignment mark are provided on the wafer such that the first and second alignment marks are substantially symmetrical to each other with respect to a center of the wafer;
   a peripheral vision acquisition system, configured to perform a first positional compensation for the wafer based on a relative positional relationship of an edge or a notch of the wafer with respect to the wafer stage; and
   a mark detection system, configured to capture images of the first and second alignment marks and perform a second positional compensation for the wafer by determining a relative positional relationship of the center of the wafer with respect to a center of the wafer stage based on positions of the first and second alignment marks in a coordinate system of the mark detection system, wherein the mark detection system allows a higher centering and orientation accuracy of a pre-alignment process;
   wherein each of the first and second positional compensations comprises a compensation for both a positional deviation and an angular deviation, and wherein the coordinate system of the mark detection system has a horizontal axis defined by a line passing through the center of the wafer stage and a center of the mark detection system and a vertical axis defined by a line crossing the horizontal axis at right angles and passing through the center of the wafer stage.

2. The pre-alignment apparatus for a wafer as recited in claim 1, wherein the mark detection system is configured to calculate a rotation angle and a deviation between a coordinate system of the alignment marks and the coordinate system of the mark detection system based on coordinates of the first and second alignment marks in the coordinate system of the mark detection system, and to further determine a relative positional relationship between the center of the wafer and the center of the wafer stage based on the rotation angle, the deviation and a relative positional relationship between an origin of the coordinate system of the alignment marks and the center of the wafer, and wherein the coordinate system of the alignment marks has a horizontal axis defined by a line segment connecting the first and second alignment marks, the origin defined as a midpoint of the line segment connecting the first and second alignment marks and a vertical axis defined by a line passing through the origin and crossing the line segment at right angles.

3. The pre-alignment apparatus for a wafer as recited in claim 1, wherein the peripheral vision acquisition system comprises a linear array CCD detector, and wherein the mark detection system comprises a planar array CCD detector.

4. The pre-alignment apparatus for a wafer as recited in claim 1, wherein the mark detection system comprises a motion assembly, a focus adjustment assembly and a vision assembly for mark acquisition, the motion assembly configured to drive the vision assembly for mark acquisition to search for the first or second alignment mark, the focus adjustment assembly configured to adjust a focal length of the vision assembly for mark acquisition with respect to the first or second alignment mark, the vision assembly for mark acquisition configured to capture an image of the first or second alignment mark.

5. The pre-alignment apparatus for a wafer as recited in claim 4, wherein the focus adjustment assembly is connected to the motion assembly, and the vision assembly for mark acquisition is connected to the focus adjustment assembly, the motion assembly configured to drive the focus adjustment assembly to move along a radial direction of the wafer, the focus adjustment assembly configured to drive the vision assembly for mark acquisition to move along a vertical direction.

6. The pre-alignment apparatus for a wafer as recited in claim 4, wherein the vision assembly for mark acquisition comprises a point light source, a lens and a planar array CCD camera.

7. The pre-alignment apparatus for a wafer as recited in claim 1, wherein the peripheral vision acquisition system and the mark detection system are located on opposite sides of the wafer along a radial direction of the wafer.

8. A pre-alignment method for a wafer, comprising:
step 1, providing, on the wafer, a first alignment mark and a second alignment mark that are substantially symmetrical to each other with respect to a center of the wafer;
step 2, performing a first positional compensation for the wafer by a peripheral vision acquisition system based on a relative positional relationship of an edge or a notch of the wafer with respect to a wafer stage;
step 3, searching for the first and second alignment marks on the wafer and capturing images thereof by a mark detection system;
step 4, determining a relative positional relationship between the center of the wafer and a center of the wafer stage based on positions of the first and second alignment marks in a coordinate system of the mark detection system; and
step 5, performing a second positional compensation for the wafer based on the determined relative positional relationship between the center of the wafer and the center of the wafer stage, wherein the mark detection system allows a higher centering and orientation accuracy of a pre-alignment process;
wherein each of the first and second positional compensations comprises a compensation for both a positional deviation and an angular deviation, and wherein the coordinate system of the mark detection system has a horizontal axis defined by a line passing through the center of the wafer stage and a center of the mark detection system and a vertical axis defined by a line crossing the horizontal axis at right angles and passing through the center of the wafer stage.

9. The pre-alignment method for a wafer as recited in claim 8, wherein step 4) comprises calculating a rotation angle and a deviation between a coordinate system of the alignment marks and the coordinate system of the mark detection system based on coordinates of the first and second alignment marks in the coordinate system of the mark detection system, and further determining a relative positional relationship between the center of the wafer and the center of the wafer stage based on the rotation angle, the deviation and a relative positional relationship between an origin of the coordinate system of the alignment marks and the center of the wafer, and wherein the coordinate system of the alignment marks has a horizontal axis defined by a line segment connecting the first and second alignment marks, the origin defined as a midpoint of the line segment connecting the first and second alignment marks and a vertical axis defined by a line passing through the origin and crossing the line segment at right angles.

* * * * *